United States Patent [19]

Pithie

[11] Patent Number: 4,677,631
[45] Date of Patent: Jun. 30, 1987

[54] GAS LASER POWER SUPPLY APPARATUS
[75] Inventor: James Pithie, Dundee, Scotland
[73] Assignee: Ferranti, plc, Cheadle, England
[21] Appl. No.: 781,712
[22] Filed: Sep. 30, 1985
[30] Foreign Application Priority Data Oct. 2, 1984 [GB] United Kingdom ............... 8424863

[51] Int. Cl.[4] ............................................. H01S 3/00
[52] U.S. Cl. ...................................... 372/38; 372/33; 372/81
[58] Field of Search ............................ 372/38, 33, 81; 323/361; 328/67; 361/173, 174

[56] References Cited

FOREIGN PATENT DOCUMENTS

A20043112 of 0000 European Pat. Off. .
A183/01555 of 0000 World Int. Prop. O. .
A180/00776 of 0000 World Int. Prop. O. .
1598546 of 0000 United Kingdom .
1161948 of 0000 United Kingdom .
1080898 of 0000 United Kingdom .
444307 of 0000 United Kingdom .
1276814 6/1972 United Kingdom .................. 372/38
1520840 8/1978 United Kingdom .................. 372/38

Primary Examiner—Leon Scott, Jr.
Attorney, Agent, or Firm—Dennis P. Clarke

[57] ABSTRACT

Power supply apparatus for a gas laser discharge tube (10) having anode and cathode electrodes (11 and 12) comprises a first power supply (13) operable to satisfy the running power requirements of the discharge tube. A second power supply (16) is also provided and is operable to generate a voltage which, when connected in series with the output of the first power supply (13) causes the initiation of a discharge in the discharge tube (10). A spark gap (17) is operable to connect the outputs of the two power supplies in series with one another when the discharge is to be initiated.

4 Claims, 3 Drawing Figures

GAS LASER POWER SUPPLY APPARATUS

This invention relates to power supply apparatus for gas laser.

Gas lasers, in common with other gas discharge devices, require the discharge to be initiated by the application of a short pulse at a voltage greater than the normal running voltage. Preferably the striking pulse should be short and have a fast rise time, of the order of ten microseconds or less. Whatever the arrangements for supplying the running voltage, the provision of the striking pulse may cause problems.

One common method used to provide the striking pulse is to use a pulse transformer with a fast rise time to generate the striking pulse. This is satisfactory if the pulse voltage is below about 15 kV. However the use of higher voltages leads to a transformer with a high turns ratio and hence high impedance, resulting in slow pulse rise times. An alternative technique is to ensure that the voltage across the discharge tube is always in excess of the striking voltage. Large ballast resistors are necessary to ensure discharge stability, and such an arrangement is very inefficient in energy terms.

It is an object of the invention to provide gas laser power supply apparatus having simple and efficient means for generating a striking pulse for a gas discharge laser.

According to the present invention there is provided gas laser power supply apparatus which includes a first power supply operable to satisfy the running power requirements of a gas laser discharge tube, a second power supply operable to generate a voltage which when connected in series with the output of the first power supply causes the initiation of a discharge in the discharge tube, and switch means operable to connect the outputs of the first and second power supply in series with one another only when initiation of the discharge is required.

According to a preferred embodiment of the invention the first and second power supplies comprise first and second parts of a Cockroft-Walton voltage multiplier and the switch means comprises a spark gap.

The invention will now be described with reference to the accompanying drawings, in which.

Figure 1:
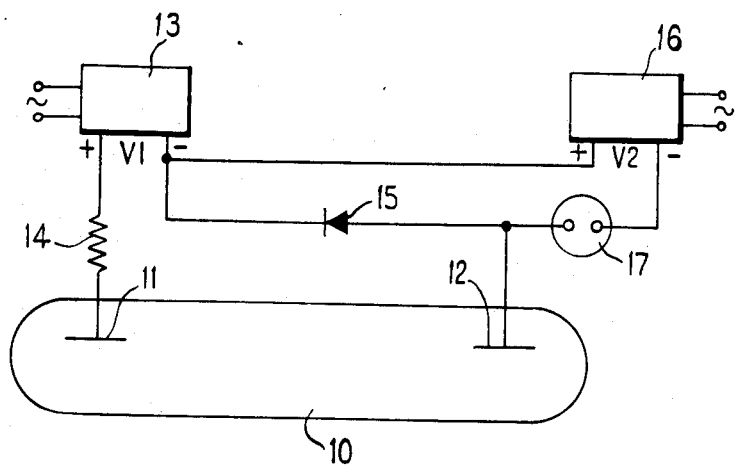
FIG. 1 is a schematic block diagram of the invention.

Referring now to FIG. 1, a gas laser discharge tube is shown schematically as comprising a sealed discharge tube 10 containing a gaseous laser active medium. An anode electrode 11 and a cathode electrode 12 are provided between which a discharge is formed when the laser is in operation. A first power supply 13 has its positive output connection connected to the anode 11 through a ballast resistor 14 and has its negative output connection connected to the cathode 12 through a diode 15 poled as shown. The power supply 13 is rated to supply the normal voltage and current required to maintain a discharge in the tube once the discharge has been formed, but will not cause initiation of the discharge.

A second power supply 16 has its positive output connection connected to the negative output connection of the first power supply 13, and has its negative output connection connected through a switch 17, such as a triggered spark gap or thyratron to the cathode 12 of the laser discharge tube 10. Each of the power supplies 13 and 16 is fed from a conventional a.c. supply.

In operation the first power supply 13 applies the normal running voltage V1 between the anode 11 and cathode 12 of the discharge tube 10, but this is insufficient to initiate the discharge. The second power supply 16 generates an additional voltage V2. When the switch 17 is closed the output of the two power supplies 13 and 16 are connected in series to provide a voltage V1+V2 which is sufficient to initiate the discharge. Diode 15 prevents the short-circuiting of the output of power supply 16 and isolates the two power supplies from one another.

When the discharge has been struck the second power supply 16 is no longer required. The mechanism (not shown) which operates the switch 17 may therefore be arranged to switch off the second power supply. The switch must be of a type which will withstand the voltage generated by the second power supply 16.

The first and second power supplies 13 and 16 may take a number of forms. A typical laser discharge tube may have a running voltage of 16 kV at a current of 8 mA, and require a 28 kV pulse to initiate the discharge. The first power supply 13 must therefore be capable of satisfying the running requirements of the discharge, whilst the second power supply 16 must provide the additional voltage in a pulse having a sufficiently rapid rise time.

Figure 2:
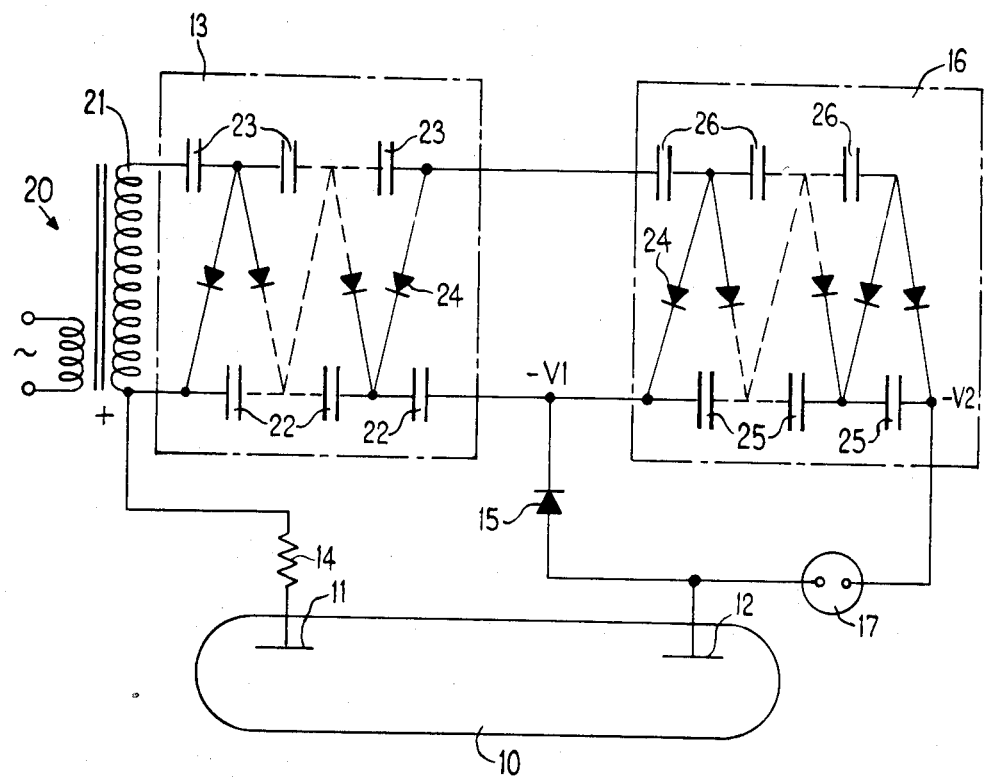
FIG. 2 is a circuit diagram of a first embodiment of the invention of FIG. 1.

FIG. 2 illustrates one particular power supply arrrangement which is particularly simple and efficient for the purpose set out above. Referring now to FIG. 2 it will be seen that each power supply comprises part of a conventional Cockroft-Walton voltage multiplier. A transformer 20 has each end of its secondary winding 21 connected to a number of series-connected capacitors 22 and 23. A network of diodes 24 is connected between the capacitors as shown. A number of stages make up the first power supply 13 of FIG. 1 as indicated by the broken outline. The second power supply 16 is made up of a number of further stages, the capacitors 25 and 26 of which may be smaller since the power requirements of the second stage are very much less. The switch 17 may be a simple two-electrode spark gap which breaks down when the voltage generated by the second power supply rises to a sufficiently high value.

When power is applied to the transformer 20 the capacitors 22, 23, 24 and 25 charge up. Since the discharge in the tube 10 has not been struck there is no load on the transformer, and the secondary voltage is such that the voltage generated by the second power supply 16 exceed the breakdown voltage of the spark gap 17. The pulse produced on breakdown of the spark gap has a very fast rise time, perhaps of the order of 1 microsecond, and a discharge is struck between the electrodes of the discharge tube. When the running power requirements are supplied by the first power supply 13 the load on the transformer 20 is such that the second power supply 16 charges to a voltage below the breakdown voltage of the spark gap 17. Further breakdown of the spark gap cannot therefore occur. This means that there is no need to disconnect the second power supply 16, since it consumes no power once the capacitors have recharged.

By way of example, using the same laser as mentioned above, the transformer 20 is arranged to have a 2 kV secondary output when the discharge is running. The first power supply comprises eight multiplier stages producing 16 kV on load. The second power supply comprises a further six stages, and the spark gap has a breakdown voltage of 13 kV. When the multiplier is not providing power to the discharge the second power supply generates 13 kV or more and is able to break down the spark gap. However, when power is being supplied to the discharge the second power supply generates only 12 kV and breakdown cannot occur.

The spark gap 17 in the embodiment of FIG. 2 may be a triggered spark gap, if more precise timing of the initiation of the discharge is required. In that case the free breakdown voltage of the spark gap could be greater than the off-load voltage generated by the second power supply.

Figure 3:
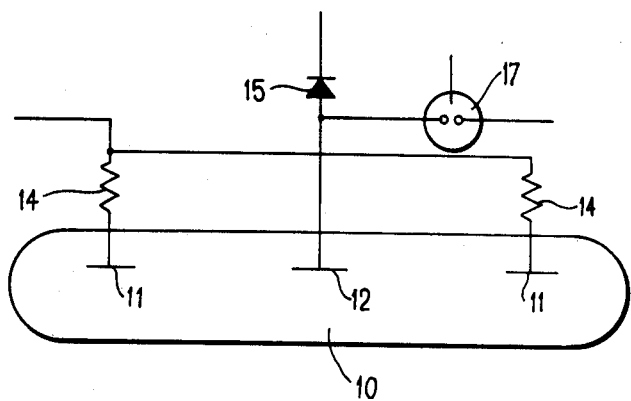
FIG. 3 is a circuit diagram of an alternative arrangement of FIG. 2.

The laser discharge tube has been shown in schematic form only. Frequently such a discharge tube has several anode and/or cathode electrodes. FIG. 3 shows a laser discharge tube having two anode electrodes 11, each with a ballast resistor 14, connected in parallel with one another to the positive output connection of the power supply 13. The power supplies 13 and 16 and spark gap 17 are as shown in FIG. 2.

What we claim is:

1. Gas laser power supply apparatus which includes a first power supply which generates a current and a first voltage output sufficient to maintain an electric discharge in a gas laser discharge tube, a second power supply which generates a second voltage output, a spark gap connecting the voltage output of said first and second power supplies in series thereby causing initiation of said electric discharge.

2. Apparatus as claimed in claim 5 in which the spark gap comprises a triggered spark gap.

3. Apparatus as claimed in claim 5 in which the first and second power supplies comprise first and second sections of a voltage multiplier circuit.

4. Apparatus as claimed in claim 3 in which the voltage multiplier circuit is of the Cockroft-Walton type.

* * * * *

UNITED STATES PATENT AND TRADEMARK OFFICE
CERTIFICATE OF CORRECTION

PATENT NO. : 4,677,631

DATED : June 30, 1987

INVENTOR(S) : James Pithie

It is certified that error appears in the above-identified patent and that said Letters Patent is hereby corrected as shown below:

In Claims 2 and 3, line 1 of each, "claim 5" should read

--claim 1--.

Signed and Sealed this

Twenty-second Day of September, 1987

Attest:

DONALD J. QUIGG

Attesting Officer     Commissioner of Patents and Trademarks